US007755110B2

(12) United States Patent
Gliese et al.

(10) Patent No.: US 7,755,110 B2
(45) Date of Patent: Jul. 13, 2010

(54) ARCHITECTURE OF FUNCTION BLOCKS AND WIRINGS IN A STRUCTURED ASIC AND CONFIGURABLE DRIVER CELL OF A LOGIC CELL ZONE

(75) Inventors: Jörg Gliese, München (DE); Winfried Kamp, München (DE); Siegmar Köppe, München (DE); Michael Scheppler, Gröbenzell (DE)

(73) Assignee: Infineon Technologies AG, Munich (DE)

( * ) Notice: Subject to any disclaimer, the term of this patent is extended or adjusted under 35 U.S.C. 154(b) by 884 days.

(21) Appl. No.: 11/088,506

(22) Filed: Mar. 24, 2005

(65) Prior Publication Data

US 2005/0212562 A1   Sep. 29, 2005

(30) Foreign Application Priority Data

Mar. 24, 2004   (DE) ............... 10 2004 014 472

(51) Int. Cl.
  *H01L 27/10*   (2006.01)
(52) U.S. Cl. ............... 257/211; 257/208; 257/209; 257/E27.105
(58) Field of Classification Search ......... 257/202–204, 257/206–211, E27.105; 326/38–41, 47
  See application file for complete search history.

(56) References Cited

U.S. PATENT DOCUMENTS

| | | | |
|---|---|---|---|
| 3,935,474 A * | 1/1976 | Komarek | 326/96 |
| 4,197,555 A | 4/1980 | Uehara et al. | 357/70 |
| 5,172,330 A | 12/1992 | Watanabe et al. | |
| 5,394,034 A | 2/1995 | Becker et al. | 326/39 |
| 5,684,412 A * | 11/1997 | Yoeli et al. | 326/39 |
| 5,717,346 A | 2/1998 | Gould et al. | |
| 5,808,479 A * | 9/1998 | Sasaki et al. | 326/41 |
| 5,958,026 A | 9/1999 | Goetting et al. | 710/52 |
| 5,999,015 A * | 12/1999 | Cliff et al. | 326/39 |
| 6,014,038 A | 1/2000 | How et al. | 326/46 |
| 6,172,547 B1 | 1/2001 | Yokoyama | |
| 6,242,767 B1 | 6/2001 | How et al. | 257/202 |
| 6,242,905 B1 | 6/2001 | Draxelmayr | 324/165 |
| 6,242,945 B1 * | 6/2001 | New | 326/39 |
| 6,300,793 B1 * | 10/2001 | Ting et al. | 326/41 |
| 6,331,789 B2 | 12/2001 | Or-Bach | 326/39 |
| 6,613,611 B1 | 9/2003 | How et al. | 438/130 |
| 6,642,744 B2 | 11/2003 | Or-Bach et al. | 326/39 |
| 6,744,248 B2 | 6/2004 | Buchhold et al. | 324/207.21 |
| 2003/0025132 A1* | 2/2003 | Tobey | 257/202 |
| 2003/0155587 A1 | 8/2003 | Smith et al. | 257/202 |
| 2003/0206036 A1 | 11/2003 | Or-Bach | 326/41 |

FOREIGN PATENT DOCUMENTS

WO   WO 98/55918   12/1998
WO   01/25976 A2   4/2001

* cited by examiner

*Primary Examiner*—Shouxiang Hu
(74) *Attorney, Agent, or Firm*—Slater & Matsil, L.L.P.

(57) ABSTRACT

An integrated semiconductor circuit has a regular array of logic function blocks (L) and a regular array of wiring zones (X) corresponding thereto. The wiring lines in at least one wiring layer of a wiring zone (X) are realized as line segments that are continuous within the wiring zone and are interrupted at zone boundaries. Furthermore, the semiconductor circuit comprises driver cells that surround a logic cell of the logic function block in an L-shaped manner.

24 Claims, 7 Drawing Sheets

10 Mask-programmable
11 switches

12 Active switches programmable by
13 electrical signals

14

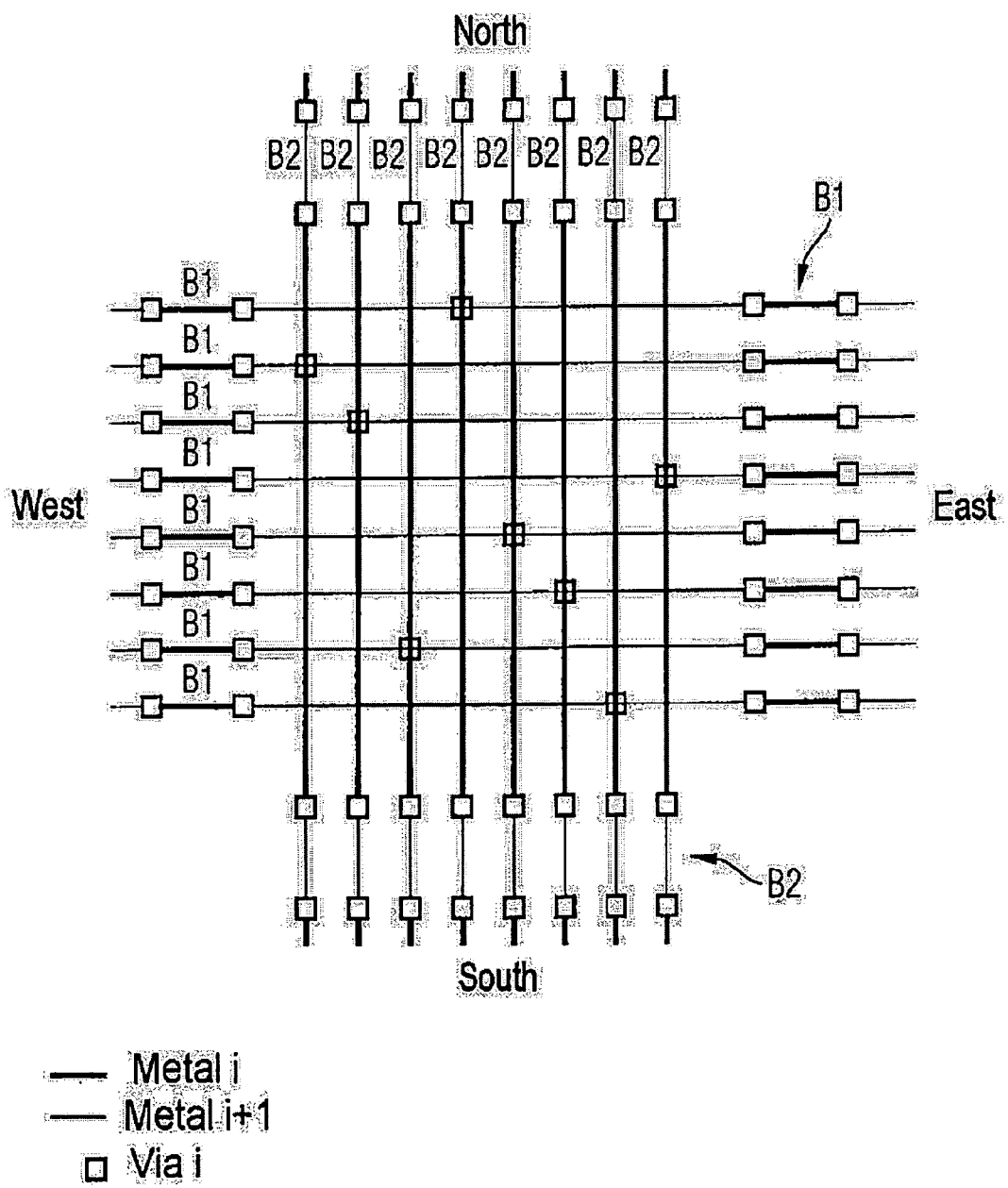

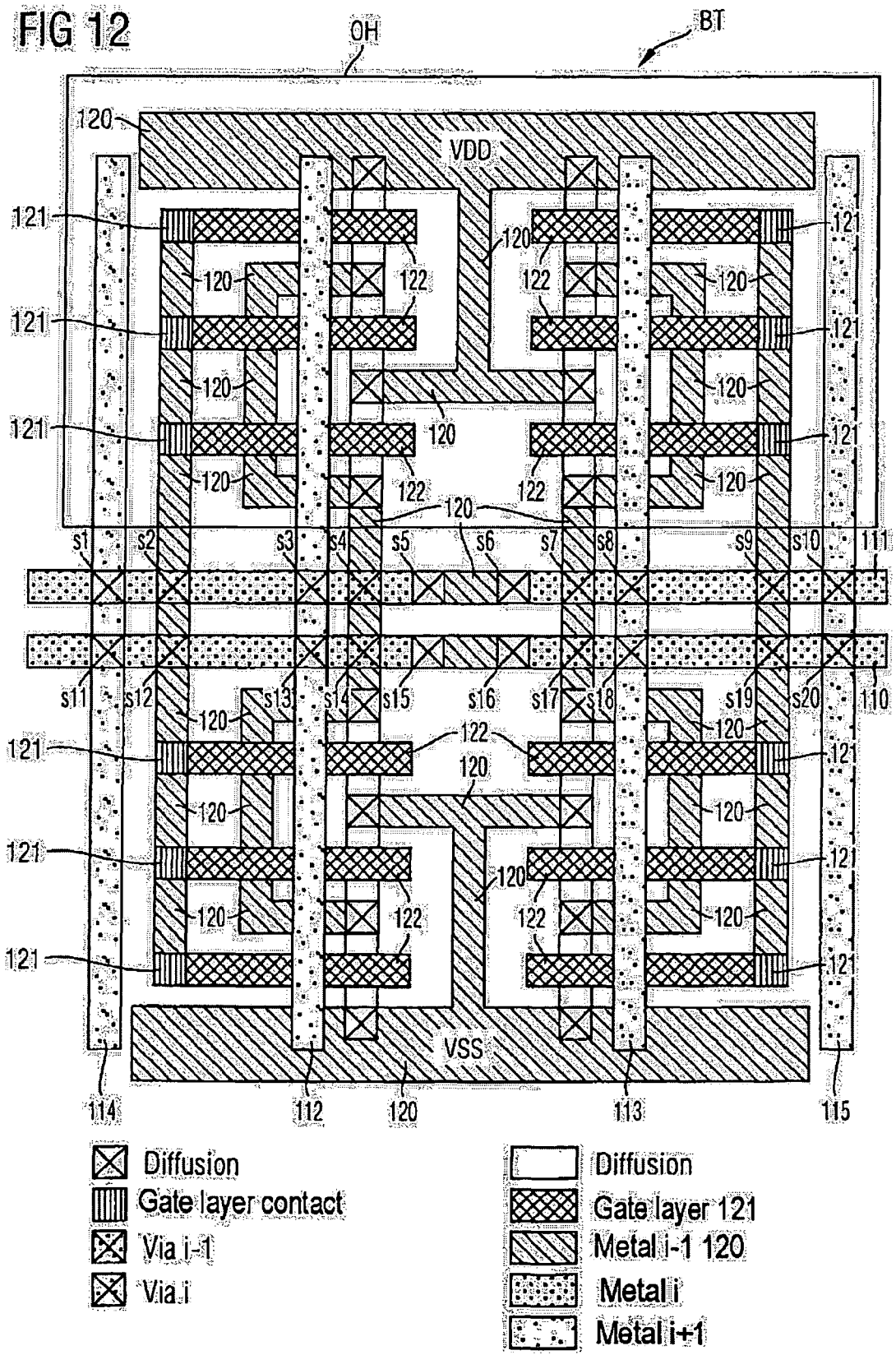

ARCHITECTURE OF FUNCTION BLOCKS AND WIRINGS IN A STRUCTURED ASIC AND CONFIGURABLE DRIVER CELL OF A LOGIC CELL ZONE

CROSS-REFERENCE TO RELATED APPLICATION

This application claims priority to German application No. 10 2004 014 472.9 filed Mar. 24, 2004.

TECHNICAL FIELD OF THE INVENTION

The invention relates to an application-specific integrated semiconductor circuit and, in particular, a mask-programmable and/or configurable architecture of a regularly structured logic array. Furthermore, the invention relates to a semiconductor circuit having a logic function block, which comprises a driver cell, and to a method for the configuration of driver resources within a semiconductor circuit.

DESCRIPTION OF RELATED ART AND BACKGROUND OF THE INVENTION

Programmable integrated semiconductor circuits comprise logic cells, which may be configurable and are wired among one another in a suitable manner. The logic cells are formed in an active layer of the semiconductor circuit, said active layer containing the CMOS transistor structures (i.e. doped semiconductor regions and gate layers) of the logic cell. The logic functions of the logic cells are defined by one or a plurality of wiring layers that are situated above the active layer and realize the internal wiring of the logic cell. Such wiring layers that define the logic function of a cell are also referred to as "intraconnect". Configurable logic cells are known in the literature e.g. as CLB (configurable logic block). The designation logic function block is used hereinafter for a logic cell.

Every logic function block has to be fed a supply voltage and, in the case of a more complex construction, also has to be fed, if appropriate, global signals such as RESET, scan test and clock supply. Further wiring layers are provided for this in the semiconductor circuit. Moreover, wiring layers that perform the routing for the input and output signals of the logic function blocks are required. These are referred to as "interconnect".

Whereas the wiring layers for the power supply, the clock supply, and in some cases also the wiring layer(s) for the definition of the function of the logic function blocks are fixedly predetermined, the signal routing is always customizable. For the application-specific adaptability or customizability of the signal routing, it is possible to provide mask-programmable wiring layers for the signal routing and/or mask-programmable insulation layers between the wiring layers or electrically controllable switches for the flexible configuration of the "interconnect".

Programmable semiconductor circuits differ inter alia by virtue of the complexity of the logic function blocks used and the degree of customization of the wirings. Gate arrays use individual transistors or very small groups of transistors as logic function blocks, while the entire wiring (interconnect and intraconnect) is customized. The advantage of gate arrays consists in their high logic density, but the high individuality of the metallization masks causes high costs for the fabrication of the individual wiring layers. In modem fabrication technologies, the costs for the masks of the active structures form the principal proportion of costs for the set of masks. In gate arrays, the mask costs for the active structures can be distributed between a plurality of applications by means of predefinition. However, all wiring planes including the wiring in the intervening insulation layers (vias) always have to be created anew since the possibilities for utilizing predefined wiring planes have not been available heretofore.

In PLDs (Programmable Logic Devices), simple, prefabricated gates, instead of transistors, are used as logic function blocks. One example of the construction of a PLD, in which the signal routing is realized by two wiring layers with lines that run orthogonally and with an intervening insulation layer in which feedthroughs (vias) are formed between the lines of the metallization layers, is described in the document U.S. Pat. No. 4,197,555.

So-called sASICs (structured Application Specific Integrated Circuits) use partially or completely prefabricated logic function blocks having relatively high complexity. Typical logic function blocks contain combinatorial components (for example complex gates, multiplexers and a plurality of inverters or smaller look-up tables) and sequential components (for example flip-flop, multivibrators). The logic function blocks can be combined with distributed memories structures. A logic function block can perform a plurality of logic functions, in which case the selection can either be realized in the production sequence by means of a mask-programmable internal wiring "intraconnect" or can be made during operation by means of external signals or signals stored on-chip, which are fed e.g. to multiplexers within the fixed logic function block.

For the customizability of a semiconductor circuit, it is possible, in principle, for both the wiring layers for the internal wiring of the individual logic function blocks and the wiring layers for the signal routing between the logic function blocks to be varied in customizable fashion. It generally holds true that, for a cost-effective wiring, on the one hand, as many predefined, i.e. "fixed", wiring layers as possible are to be used and, on the other hand, the total number of wiring layers required is to remain as low as possible.

Typically, in the case of sASICs, mask-programmable wiring layers are placed into the upper metal layers in order to ensure that a customization of the integrated circuit has to be performed only in the upper metal layers. As a result, sASICs for different applications can be produced with the same set of masks, apart from the upper layers that can be programmed in customized fashion. This affords cost advantages in production since the integrated semiconductor circuit can initially be fabricated in non-customized fashion over many process steps in correspondingly high numbers and the customization has to be effected only in the final process steps. What is disadvantageous, however, is that long, vertical multiple feedthroughs (so-called stacked vias) between the customized upper wiring layers and the active layer of the logic function blocks impede the line routing in intervening wiring layers. A further disadvantage is that experience shows that fabricating such multiple feedthroughs extending over a plurality of layer strata poses difficulties and can therefore impair the production yield.

Programmable semiconductor circuits can furthermore be differentiated by the regularity of the arrangement of the function blocks. Whereas function blocks in gate arrays are arranged in a regular cell zone in matrix form (which is referred to as an array), function blocks in traditional ASICs can be distributed in an irregularly positioned manner over the semiconductor circuit. ASICs whose logic function blocks are likewise arranged in a regular array are also referred to as structured ASICs.

sASICs are differentiated by the fact that they are constructed either with or without interspaces (so-called channels) between the individual logic function blocks. In sASICs which use the channel technique, a large part of the signal routing or the entire signal routing between the logic function blocks is carried out within the channels. In channel-free sASICs, the logic function blocks adjoin one another essentially without any gaps, the signal routing, as already described, being carried out in one or a plurality of wiring layers above the active layer containing the functional elements.

The document U.S. Pat. No. 6,613,611 B1 describes a structured ASIC whose function blocks may contain combinatorial and sequential functions and also memory functions and are arranged next to one another without any gaps in the manner of an array. The signal routing is realized by at least two metallization layers lying one above the other with mutually orthogonal conductor segments. The deeper one of the two metallization layers (e.g. M3) is fixedly predetermined, whereas the overlying metallization layer (M4) is customizable. Customizable metallization layers are always realized as topmost metallization layers.

A further aspect in the design of semiconductor circuits comprising a plurality of function blocks consists in the need to provide long lines at the output of a function block, given a large load or large fan-out of the signal paths, with a driver that compensates for the long delay of a datum that otherwise arises. Furthermore, signals that are transmitted over long wiring lines have to be refreshed. It is thus necessary to provide distributed driver resources within the semiconductor circuit in such a way that, if possible, all propagation time problems can be solved within the semiconductor circuit, which may also comprise the targeted delay of a signal path. On the other hand, however, the semiconductor circuit should not be enlarged unnecessarily by many, ultimately unutilized drivers.

The following approaches are known for solving this problem:

1. The problem is solved in a function-block-based manner in that each output of a logic function block is assigned a driver having a high strength, or the output can be switched over between a plurality of drivers having differing strengths that are kept available. In the case of this approach, some logic function blocks do not utilize or do not fully utilize their drivers, and at the same time situations usually occur in which the existing driver strength does not suffice for some critical paths in the semiconductor circuit.

2. As an alternative, a common driver cell may be assigned to a certain number of logic function blocks in the wiring structure of the semiconductor circuit. The problem of unused or insufficient driver resources can be solved better in this way. Such a local common driver cell must be able to be reached from all associated logic function blocks in the vicinity, which is associated with a higher wiring outlay. Local peaks in driver demand (hotspots) also cannot be completely satisfied in this way.

3. Modern FPGA (Field Programmable Gate Array) architectures combine local drivers in accordance with (1) with drivers in the local wiring region in accordance with (2) and further global driver resources. In this way, generally, even critical signals can be driven sufficiently. However, this concept is very complex and requires a great deal of chip area.

SUMMARY OF THE INVENTION

The invention is based on the object of specifying a new construction concept for a structured ASIC which enables a cost-effective production of ASICs. Furthermore, the invention aims to specify a semiconductor circuit which enables an efficient configuration and allocation of driver resources in the semiconductor circuit. Finally, the intention is to provide a method for the efficient configuration of driver resources within a semiconductor circuit.

An ASIC according to the invention comprises a regular array of logic function blocks, which is formed in an active layer of the semiconductor circuit and in at least one first wiring layer for partially or definitively defining the function of the logic function block. An array of wiring zones corresponding to the array of logic function blocks is provided for the signal routing. The array of wiring zones comprises at least two wiring layers with wiring lines that are not parallel to one another and with an insulation layer situated between the wiring layers. At least in one of the two wiring layers, the wiring lines are realized as line segments that are continuous within a wiring zone and are interrupted at wiring zone boundaries. At least the lower wiring layer of a wiring zone has connections to the at least one first wiring layer.

The fact that a logic function block corresponds to precisely one wiring zone (which is defined by the fact that it contains at least one wiring layer with wiring lines that constitute line segments that are continuous within the wiring zone and are interrupted at the wiring zone boundaries) means that a construction concept having high regularity is produced, which affords a multiplicity of advantages: the regularity enables the design process (design flow) to be simplified since wiring zones recur in accordance with the function blocks in the array and the predictability of the circuit design is improved by this regularity. On account of its regular array structure, the wiring for the signal routing is readily scaleable i.e. the number of wiring layers can be varied in a simple manner in the design process. A further advantage is that the wiring lines in the (at least) one wiring layer in which the wiring lines are realized as line segments that are continuous within a zone and are interrupted at the zone boundaries can be produced by means of a predetermined, i.e. non-customizable metallization mask. This simplifies the production process, increases the yield and enables the optimization of the arrangement of the line segments with regard to crosstalk. Furthermore, the construction concept is suitable for a channel-free arrangement of logic function blocks, so that a high density of the function block layout can be obtained.

Preferably, the wiring lines in the other of the at least two wiring layers are likewise realized as line segments that are continuous within a zone and are interrupted at zone boundaries. In this case, a second metallization mask provided for the signal routing is also a predefined, i.e. non-customizable metallization mask. The regularity of the construction concept of the integrated circuit is increased by this second predefined wiring layer in the integrated semiconductor circuit. As will be explained in greater detail later, the signal routing in the sASIC can be defined by "switches" arranged in customized fashion between the two wiring layers.

In a particularly advantageous manner, the wiring layers provided for the signal routing are preferably arranged as deeply as possible, in which case the customizable layer or layers (generally, at least the insulation layer situated between the two wiring layers for the signal routing is a layer that can be customized by defining feedthroughs (vias)) may be situated at a deep level, i.e. need not be the topmost or one of the upper layers in the semiconductor circuit.

Specifically, this may signify the following:

If the function of a logic function block has already been completely defined by the at least one first wiring layer (so-called prewiring), the at least two wiring layers of a wiring zone are preferably situated directly above the first wiring layer or layers (which, as stated, definitively determine the logic function). In this case, the wiring for the signal routing has no influence on the function of a logic function block.

In the case of an only partial definition of the function of the logic function block by the at least one first wiring layer (prewiring), the definitive definition of the function of the logic function block requires at least one further wiring layer or a configurable connection in an insulation layer. In this case, one advantageous refinement of the invention is characterized in that the further wiring layer for definitive definition of the function of the logic function block is situated directly above the at least one first wiring layer that only partially defines the function of the logic function block, and coincides with the bottommost one of the at least two wiring layers of a wiring zone.

In the case where an insulation layer is present in which the configurable connection for definitive definition of the function of the logic function block is realized, this insulation layer preferably coincides with the insulation layer present between the two wiring layers of a wiring zone. Another, likewise preferred possibility consists in the fact that said insulation layer in which the configurable connection for definitive definition of the function of the logic function block is realized coincides with the insulation layer situated directly below the lower wiring layer of a wiring zone.

In other words: the wiring zone is preferably situated directly above the prewiring, to be precise independently of whether the prewiring already effects a complete (i.e. definitive) or only partial definition of the logic function of the logic function block (in the second case, the wiring zone may furthermore contribute to the complete definition of the logic function).

Therefore, the invention abandons the concept—known from the prior art (e.g. U.S. Pat. No. 6,613,611 B1)—of effecting customization as "late" as possible in the metallization sequence. The disadvantage of customization in the deeper layers of the "interconnect" (wiring layers and/or intervening insulation layers) is compensated for by the fact that a higher regularity of the wiring can be achieved there. Clearly the capability of achieving a higher regularity of the wiring given a deepest possible wiring for the signal routing can be understood by the fact that the vertical distance between the wiring layers for the signal routing and the active layer is small, so that, as a rule, the contact-connection between the wiring layers for the signal routing and the logic function block can be realized with just one or at most two vias. As a result of the proximity between the wiring layers for the signal routing and the active layer with the logic function blocks, it is significantly simpler to ensure the geometrical correspondence according to the invention between the array of logic function blocks and the array of wiring zones. If, by contrast, the signal routing is carried out in upper layers of the integrated semiconductor circuit, as in the prior art, the contact-connection of the logic function blocks, as already mentioned, requires multiple feedthroughs ("stacked vias") which run through a plurality of metallization layers. Since these multiple feedthroughs do not run vertically in a straight line, but rather, as a rule, are led on from one layer to the next with a horizontally stepped offset, an imaging of the array of the logic function blocks into the wiring layers for the signal routing would be possible only with difficulty or not at all in the prior art.

Since significantly fewer multiple feedthroughs occur in the case of the invention than in the prior art, both the problem of blocking of intermediate layers by multiple feedthroughs and the problem of the possible reduction of the yield on account of multiple feedthroughs are overcome.

In general, it is possible to provide either active switches or mask-programmable switches between the at least two wiring layers for the signal routing. Since active switches are more complex and require area in the active layer, a particularly preferred refinement of the invention is characterized in that mask-programmable connections (vias or metal bridges) are provided between the at least two wiring layers for the signal routing.

In this case, an advantageous development of the invention is characterized in that connections between wiring lines of the at least two wiring layers of a wiring zone are formed by vias, while connections between wiring lines of adjacent zones within a wiring layer are realized by metal bridges.

Furthermore, it is preferred for the connections between the lower wiring layer of a wiring zone and the at least one first wiring layer situated underneath (prewiring) to be formed by mask-programmable switches, in particular vias in an intervening insulation layer.

On account of the possibility according to the invention of producing a greatest possible proximity between the active layer and the wiring layers for the signal routing between the logic function blocks, it is advantageous for a wiring layer for the supply line routing for the logic function blocks to be situated above or at least within the at least two wiring layers for the signal routing.

It is advantageous in an analogous manner if a wiring layer for the clock supply for the logic function blocks is situated above or at least within the at least two wiring layers for the signal routing.

Various possibilities arise for the realization of the logic function blocks: a logic function block may contain solely sequential logic or solely combinatorial logic or combined sequential and combinatorial logic. Furthermore, it is advantageous if the logic function block furthermore contains additional transistor resources. The latter may be utilized e.g. by means of an internal wiring as driver circuits for the inputs/outputs of the logic function block, or may, if appropriate, also remain unutilized in the logic function block.

In an advantageous manner, each logic function block may furthermore be equipped with a memory.

Preferably, the construction of a logic function block is comparatively complex, and a logic function block may have a plurality of outputs. Furthermore, various predefined function blocks may be provided in the "heterogeneous" array.

According to a second aspect of the invention, the formulated object is achieved by means of the features of the independent Claims 22 and 41. Advantageous refinements and developments of the invention are specified in the subclaims.

Accordingly, a semiconductor circuit having a logic function block comprises a logic cell, which implements the desired logic functionality of the logic function block, and a driver cell, which contains transistors for amplifying signals. According to the invention, the driver cell surrounds the logic cell on at least two sides.

The fact that the driver cell surrounds the logic cell on at least two sides ensures that all wirings that run in any direction across the logic function block always have access to the driver cell. This is because every wiring running across the logic function block crosses at least one limb of the driver cell, so that a direct (e.g. vertical or almost vertical) connection between the wiring and the driver cell can be produced at this location by means of one or more feedthroughs. Since the driver cell encompasses the logic cell on (at least) two sides, it is furthermore possible to ensure, without a high outlay and detours in the line routing, that the outputs of the logic cell have access to the driver cell. Consequently, the driver cell optimally supports the concept of accommodating in the driver cell a driver of output signals of the logic cell, a driver for the local wiring (i.e for a local group of adjacent logic function blocks) and also a driver for refreshing (i.e. re-establishing the integrity of) signals that are transmitted by means of global, long connections. The use of a driver cell may serve for increasing the signal propagation time and thus for "hold time fixing" in order to fulfil the hold conditions of a synchronous circuit. It can also be utilized for reducing the delay of transmitted signals in order, by way of example, to fulfil the set-up conditions ("set-up time fixing") of a synchronous circuit.

Preferably, the driver cell is L-shaped, i.e. it surrounds the logic cell on precisely two sides. However, it is also possible for the driver cell to encompass the logic cell on more than two sides or even completely.

Preferably, the driver cell is constructed from a plurality of identical basic transistor structures each comprising a plurality of transistors that are prewired in a predetermined manner. The transistors of a basic transistor structure may be prewired for example to form independent, small inverter or buffer structures. Since their assignment to outputs of the logic cell and also to the local or global wirings of the semiconductor circuit is not fixed from the outset, but rather can be defined in the context of the design or configuration process, this modular construction of the driver cell enables driver strength to be allocated as required (by connecting a plurality of basic transistor structures in parallel) for the respective driver task. To put it clearly, the driver resources made available by the driver cell, by means of configuration, may be used as required for different purposes (driving the output signals of the logic cell, driving signals by means of the local wiring and driving signals by means of the global wiring). A signal delay can correspondingly be realized by suitably connecting in series an adequate number of weakly dimensioned driver resources.

A particular advantage is achieved if a plurality of logic function blocks in which the driver cell surrounds the logic cell in each case in an L-shaped manner are arranged in array form in the semiconductor circuit. In this case, the logic cells of the array of logic function blocks are always encompassed by a driver structure.

A preferred embodiment variant of the semiconductor circuit according to the second aspect of the invention is characterized in that the logic function block is coupled to a wiring zone in the wiring structure of the semiconductor circuit which comprises at least two wiring layers with wiring lines that are not parallel to one another and with an insulation layer situated between the wiring layers, wiring lines of the different wiring layers being connected by means of a mask-programmable and/or configurable direction-changing switch. What is achieved by means of the configurable direction-changing switch is that wiring lines that are in contact with the driver cell can change direction. An extremely flexible routing of signals is thereby supported.

A preferred realization of the direction-changing switch consists in the latter being formed by mask-programmable vias in the insulation layer between the different wiring layers. Generally, the direction-changing switch may also be realized by tristate buffers, pass gates or transfer gates.

A further preferred refinement of the semiconductor circuit according to the second aspect of the invention is characterized in that mask-programmable and/or configurable switches are provided at the boundaries of the wiring zone, by means of which switches the wiring lines are connected to or isolated from wiring lines of adjacent wiring zones. What is thereby made possible is that unrequired "compass directions" of the wiring lines can be separated and thus turned off before and after the change in direction.

Therefore, while the routing behaviour of the logic function block is determined by the direction-changing switches and the switches at the boundaries of the wiring zone, a suitable contact-connection of the prewired driver cell to the wiring zone can be used to define what signal is to be driven and what driver strength is used for signal driving (the contact-connection is performed such that e.g. a suitable number of basic transistor structures for signal driving are connected together).

It is pointed out that a special wiring concept is not required for the semiconductor circuit according to the second aspect of the invention. Locally unused driver resources can be used globally, and vice versa. Any driver cell can thus be used for any type of connection and, in principle, also for any arbitrary combination of connections as long as the total available driver strength of a driver cell is not exceeded. This ensures a significantly better capacity utilization of the existing driver strength whilst largely maintaining the locality.

In a method for the configuration of driver resources within a semiconductor circuit according to the second aspect of the invention, a first step involves defining the desired functionality of each driver cell with regard to its function as driver cell for output signals of the logic cell and/or as driver cell for driving signals of a local group of logic function blocks and/or for refreshing global signals or else for signal delay. A second step involves determining a driver-cell-specific contact-connection between the wiring structure of the semiconductor circuit and the driver cells for realizing the desired driver functionality. The specific fashioning of the driver cell enables a flexible allocation of driver resources in accordance with the abovementioned steps.

BRIEF DESCRIPTION OF THE DRAWINGS

The invention is explained in more detail below on the basis of exemplary embodiments with reference to the drawings, in which:

FIG. 11 shows an example of the layer construction of a mask-programmed wiring zone for the driver cell in a logic function block realized as a crossbar distributor (the linking/connection to the underlying logic function block is not explicitly illustrated); and FIG. 12 shows a circuit example for a basic transistor structure that can be contact-connected by a wiring.

DETAILED DESCRIPTION OF PREFERRED EMBODIMENTS

Figure 1:
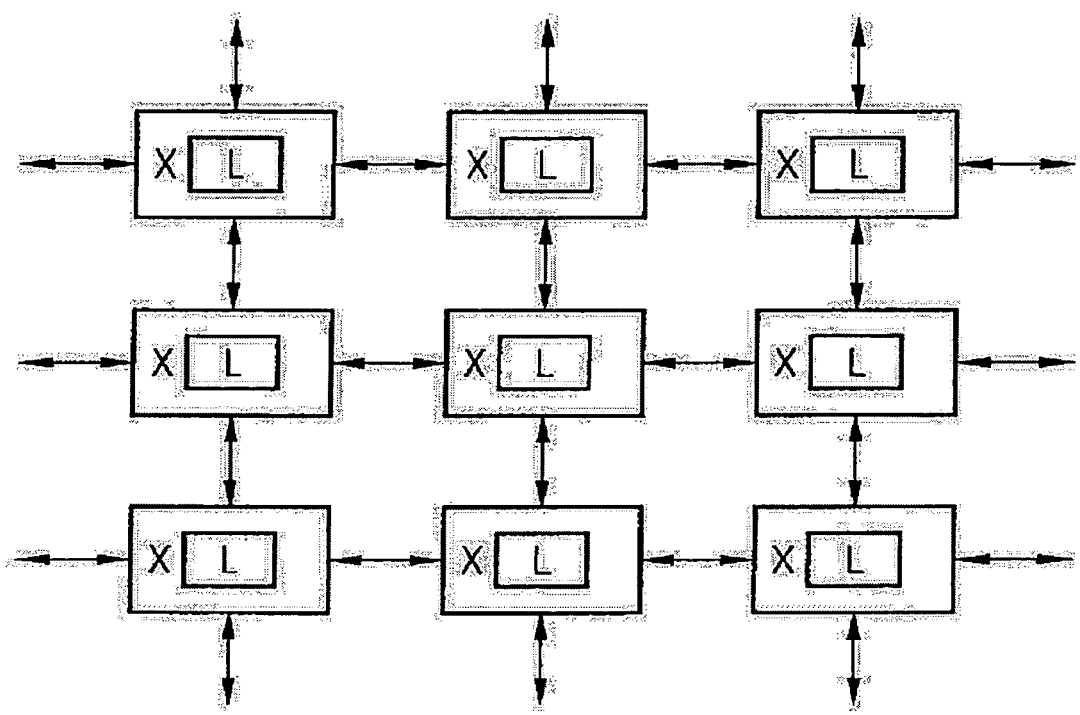
FIG. 1 shows a schematic illustration of a structured ASIC according to the invention with a regular array of logic function blocks and a regular array—corresponding thereto—of wiring zones for the signal routing.

FIG. 1 schematically shows the architecture of a semiconductor module according to the invention. The semiconductor module is based on an array of logic function blocks L each having identical logic structures. Identical logic structures means that the logic function blocks in the active layer are identical. Each logic function block L is assigned a wiring zone X which contact-connects the respective logic function block with regard to its input and output signals. The wiring zones X are arranged in an array which provides for the routing of the signals between different logic function blocks and corresponds to the array of logic function blocks L. The spacings between the logic function blocks L or the wiring zones X within the arrays are merely illustrated for the sake of better clarity; in practice, the logic function blocks L and the wiring zones X may essentially adjoin one another without any interspaces.

On account of the geometrical correspondence of the two arrays (array of logic function blocks L and array of wiring zones X for the signal routing) and the preferably channel-free construction, mention is also made illustratively of a tile-based construction concept, each tile comprising a logic function block L and the corresponding wiring zone X.

It is pointed out that the arrays need not necessarily realize a grid structure with orthogonal connections, rather that it is also possible to provide other array geometries, such as, for example, a two-dimensional grid with non-orthogonal connections or, if appropriate, also crossings between more than two connections (as will be explained in greater detail below, it would be necessary in this case to use at least three wiring layers for constructing a wiring zone X).

Figure 2:
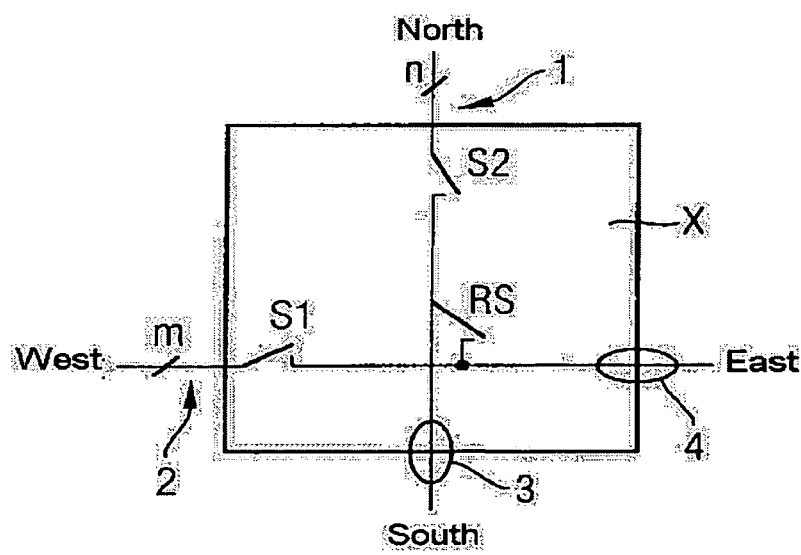
FIG. 2 shows an equivalent circuit diagram of a wiring zone (the linking/connection to the underlying logic function block is not explicitly illustrated)

FIG. 2 shows a functional illustration of a wiring zone X in the case of two wiring layers with line bundles that cross one another. The line bundle 1 extending in the north-south direction comprises n individual lines, while the line bundle 2 extending in the west-east direction comprises m individual lines. n and m are integers which do not have to be identical. The wiring zone X has three switch groups S1, S2 and RS (referred to hereafter as switches for simplification). The two switches S1 and S2 are arranged at two boundaries of the wiring zone X (or the "tile"). Depending on the switch position, the two switches S1 and S2 connect or isolate adjacent wiring zones X. The direction-changing switch RS at the crossover point of the two line bundles 1, 2 connects or isolates orthogonal line bundles 1, 2, i.e. effects a change of direction in the routing of a signal.

Connecting switches corresponding to the switches S1, S2 may likewise be present, in a manner that is not illustrated, at the locations 3, 4 in the edge region analogously to S1 and S2.

Figure 3:
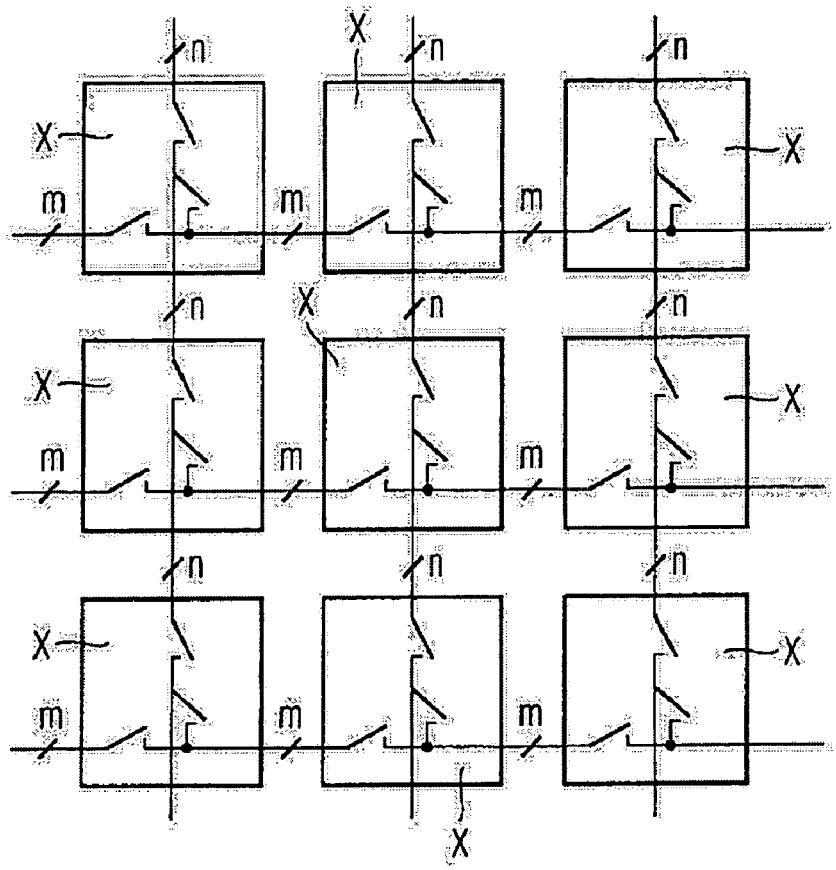
FIG. 3 shows the regular array of wiring zones (the linking/connection to the underlying logic function block is not explicitly illustrated)

FIG. 3 shows a functional illustration of an array of wiring zones X in accordance with FIGS. 1 and 2. Each wiring zone X has a direction-changing switch RS, so that the direction-changing switches RS are likewise arranged in the form of an array. The direction-changing switches RS may be realized as crossbar distributors (crossbars). It becomes clear that, by virtue of the architecture shown in FIG. 3, any conceivable path is switchable through the array of wiring zones X. A multiple utilization of a signal line track for different signals is made possible on account of the switches S1, S2 at the boundaries of the wiring zones X.

Some of the tiles (combination of wiring zone X and logic function block L) illustrated in FIG. 1 can be rotated through 90°, mirrored or geometrically transformed in some other way, although the logic structure and the area are usually retained. The signal flow through the switches S1, S2 and RS is bidirectional.

Figure 4:
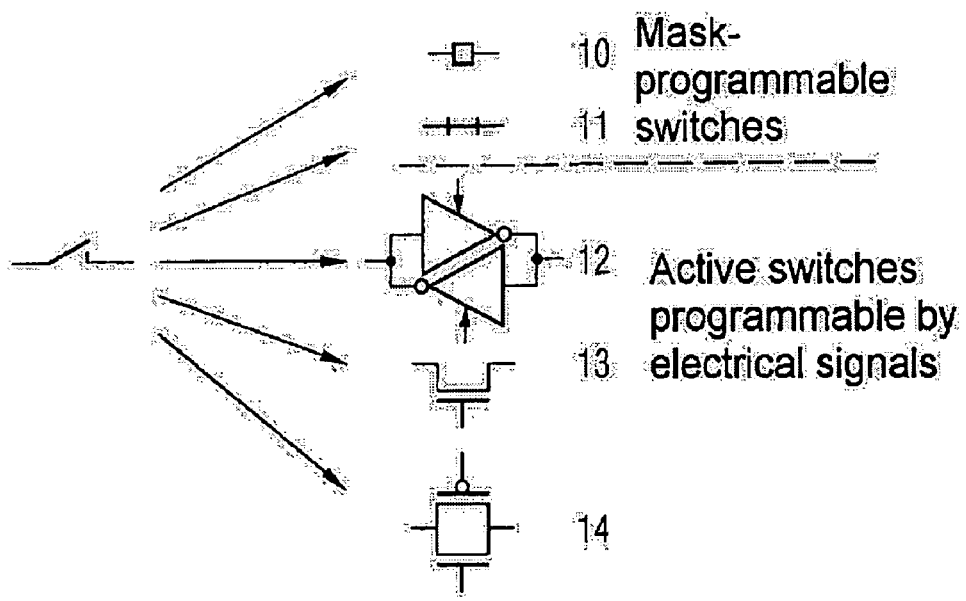
FIG. 4 shows possible embodiments of mask-programmable or configurable "switches" in the wiring zone.

There are various possibilities for implementing the switches S1, S2 and RS of the wiring zones X, see FIG. 4. A distinction is made between mask-programmable switches, which, although they can be predetermined in a customized manner in the production process, are implemented fixedly after the production of the semiconductor module, and active switches, which are configurable even in the finished module by means of electrical signals. Said electrical signals may be fed in externally or, alternatively, be generated and stored on-chip.

Via contacts 10 are mask-programmable switches which are used for contact-connecting to one another two line segments in different, adjacent wiring layers. The square symbol illustrated in FIG. 4 may also symbolize two or more vias which are provided in redundant fashion between the same layers for the purpose of increasing the yield.

Mask-programmable switches furthermore include metal bridges 11 which connect two different line segments in the same wiring layer. One possibility for implementing metal bridges 11 consists in providing a short metal bridge segment in that wiring layer which is situated directly below or directly above the wiring layer in which the two line segments to be connected are situated. The metal bridge segment must overlap the two line segments and be connected in each case by means of a conductive via. A second possibility for implementation consists in providing the metal bridge segment in the same wiring layer in which the two line segments to be connected are situated. Since metallization masks in modern technologies are more cost-effective than via masks, cost advantages are thereby afforded.

In principle, the switches S1, S2 and RS may also be realized by active switches. Active switches require area in the active layer, but have the advantage that they are still switchable in the finished module. Active switches may be implemented by bidirectional tristate buffers 12 (in inverting fashion as illustrated or else in non-inverting fashion in a manner that is not illustrated), pass gates 13 or transfer gates (transmission gates) 14.

Figure 5:
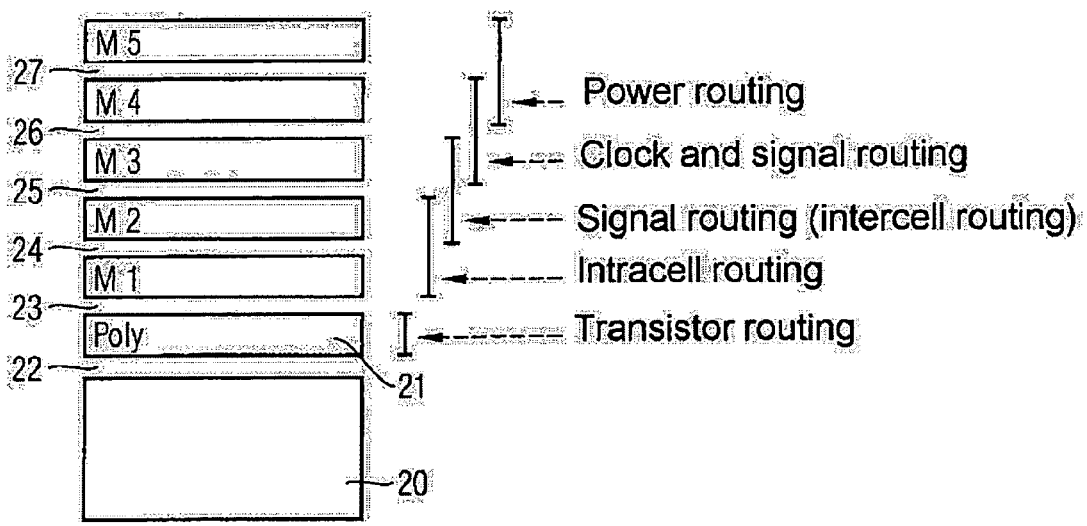
FIG. 5 shows a vertical section through the semiconductor circuit with a preferred assignment of wiring planes and wiring tasks.

FIG. 5 shows a cross section through the semiconductor module in the region of a "tile". At least one layer 21 made of polysilicon, in which the transistor gates are formed, is provided on a suitably doped silicon substrate 20 in a manner isolated by an insulation layer 22. The patterning of the active layer 20, 21 is identical in each tile. By way of example, five metallization layers M1, M2, M3, M4, M5 are applied above the polysilicon layer 21, said metallization layers in each case being insulated from one another by insulation layers 23, 24, 25, 26, 27.

The intracell routing for definition of the logic functionality of the logic function block is carried out in the layers M1 and, if appropriate, M2 or by means of a mask-programmable connection in the insulation 24 (via i–1). The intracell routing may differ in different tiles, i.e. it is possible for different logic function blocks L of the array to have different logic functions. However, it is also possible for the intracell routing to be identical for all the tiles, i.e. all logic function blocks L of the array are identical. The layers M2 and M3 serve for a signal routing, i.e. for connecting the individual logic function blocks L according to the scheme shown in FIGS. 1 to 3.

It is also possible for more than two layers to be provided for the signal routing, and it is possible for both the layer M2 and the layer M3 also to be concomitantly used for other purposes (M2: for intracell routing; M3: for clock routing). The logic inputs and outputs of the logic function block are connected to the overlying wiring zone proceeding from the wiring planes M2 (i) and M3 (i+1) provided for the intercell routing, or by means of a corresponding mask-programmable connection in the insulation layers 24 and/or 25 (via 1, and via 2).

The transmission of the clock and of the global signals and, as already mentioned, in some instances also the signal routing are carried out in the metallization layers M3 and M4 (i+n; n>0). The topmost metallization layer M5 serves for power routing, i.e. for the power supply of the logic function block in the active layer 20, 21. The linking of a logic function block or a set of logic function blocks (cluster) to the wiring plane for supply voltage routing (power routing) M4 and M5 may also be embodied in configurable fashion or be predefined.

Figure 6:
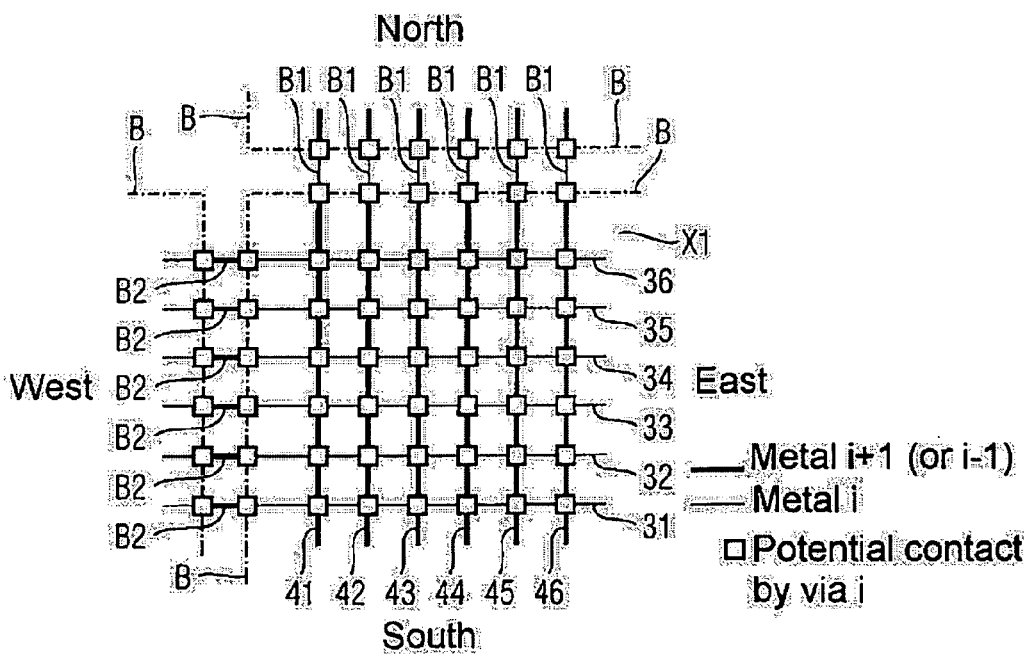
FIG. 6 shows a first example of the layer construction of a mask-programmable wiring zone.

FIG. 6 shows a plan view of a detail from a first example of a wiring zone X1 according to the invention. Only two wiring layers i, i+1 (e.g. M2 and M3) are used for signal routing in this example. The lower wiring layer i (M2) has line segments 31, 32, 33, 34, 35, 36 which lie parallel to one another and run in the west-east direction. The overlying wiring layer i+1 (M3) has line segments 41, 42, 43, 44, 45, 46 which are likewise arranged parallel to one another, that extend in the north-south direction. The line segments 31-36, 41-46 in the two wiring layers i, i+1 are continuous within the wiring zone X1 and in each case extend as far as the boundaries of the wiring zone X1. The boundary (top left corner of the wiring zone X1) is represented by a dash-dotted line B. The boundary line B is directly adjoined by the next wiring zone (not illustrated in greater detail). At the boundaries of the wiring zones X1, the line segments within the same wiring layer are interrupted, i.e. electrically insulated from one another.

Squares indicate the possible locations for mask-programmable vias at the crossover points—which occur in projection—between the line segments 31-36 and 41-46. This requires merely a single mask-programmable via insulation layer arranged between the two wiring layers i, i+1. The vias at the crossover points between the line segments 31-36 and the line segments 41-46 realize the direction-changing switch RS in mask-programmable form.

The switches S1 and S2 at the boundaries of the wiring zone X1 are realized by bridges B1 in the wiring layer i and bridges B2 in the wiring layer i+1 or i−1 in FIG. 6. The bridges B1 and B2 are thus situated in each case in a different wiring layer than that whose line segments 31-36, 41-46 are contact-connected by said bridges, and said bridges, for their part, are contact-connected by vias at their ends. The orientation of the bridges B1 is in this case perpendicular to the orientation of the line segments 31 to 36 in the deeper wiring layer i, and the orientation of the bridges B2 in the overlying wiring layer i+1 is perpendicular to the orientation of the line segments 41-46 in this wiring layer.

Figure 7:
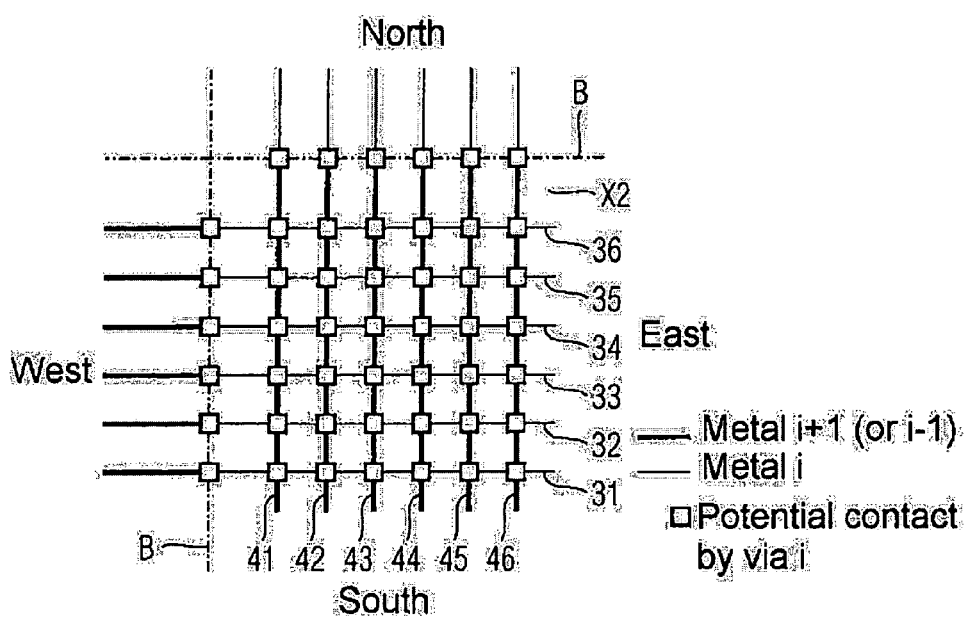
FIG. 7 shows a second example of the layer construction of a mask-programmable wiring zone.

FIG. 7 shows an alternative possibility for realizing mask-programmable switches S1 and S2 at the boundaries of wiring zones X2. The wiring zones X2 differ from the wiring zones X1 in that the line segments 31-36 and 41-46 within the same wiring layer are in each case oriented perpendicular to one another in adjacent wiring zones X2. This makes it possible to utilize each of the two wiring layers both for signal routing in the north-south direction and for signal routing in the west-east direction. In the case of the zonewise complementary utilization of the wiring layers i, i+1 as shown in FIG. 7, the switches S1 and S2 may likewise be embodied as vias in the mask-programmable insulation layer 24.

In the examples illustrated in FIGS. 6 and 7, it is advantageous to design as mask-programmable (programmable in a customized manner) the two predefined wiring layers i (M2), i+1 (M3) including the bridges B1, B2 only by means of the intervening via insulation layers (via i−1, via i). In FIG. 6, in this case, all the bridges B1, B2 are already fixedly provided in the wiring layers i, i+1, while the programming of the switches S1, S2 is realized solely by the vias by which the bridges B1, B2 are contact-connected/not contact-connected.

By stacking further wiring layers (e.g. M4, M5,...) in accordance with the schemes illustrated in FIGS. 6 and 7, the routing possibilities can be extended, with the result that it is also possible e.g. to realize wiring solutions in which more than two bundles of line segments cross one another in a wiring zone.

However, provision may also be made, by way of example, for equipping the wiring layers i+2 (M4), i+3 (M5) with line segments that extend over a plurality of wiring zones X, X1, X2, i.e. are not interrupted at the boundaries of each wiring zone. These wiring layers are then particularly suitable for signal transport over greater distances. For long transport paths, it is furthermore possible to provide signal refreshing by driver resources in the active layer.

The contact-connection of the logic function blocks L in the active layer 20, 21 of the wiring zone X, X1, X2 may likewise be carried out by means of vias, if necessary. The contact-connection of higher layers for the power supply or for the clock supply and the signal routing over longer distances may likewise be carried out by means of (stacked) vias.

Figure 8:
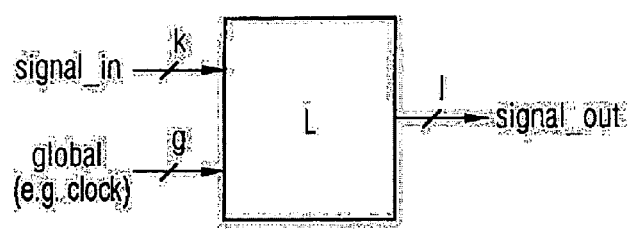
FIG. 8 shows a schematic illustration of a logic function block of a semiconductor circuit according to the invention.

FIG. 8 shows a logic function block L of the array of logic function blocks. The logic function block L preferably comprises a combinatorial part, a sequential part and transistor resources. The functionality of the logic function block may be effected by mask programming of the insulation layer 24 (via i−1) (if appropriate also 25) via i)) and prepatterning of the wiring layer M1 (if appropriate also M2) for the intracell routing. Various possibilities arise for this purpose: the logic function block L may be programmed such that it contains either only combinatorial logic or only sequential logic or a combination of combinatorial logic and sequential logic. Moreover, it may contain parallel (i.e. mutually independent) combinatorial and sequential logic. Moreover, each logic function block may be extended by a memory functionality. Differently preconfigured logic function blocks may be used in an array.

As illustrated in FIG. 8, the logic function block L may have a plurality of inputs (e.g. an input having the width k for the incoming signals from the wiring layers i, i+1 and an input having the width g for global signals (e.g. clock signals) from the overlying wiring layers i+2, i+3) and also one or a plurality of outputs (an output having the word width I is illustrated here). The number of lines k, g of the inputs and lines 1 of the output or outputs may be different in each case, and the number of lines actually utilized may vary depending on the individual configuration of the logic function block in the array.

Figure 9:
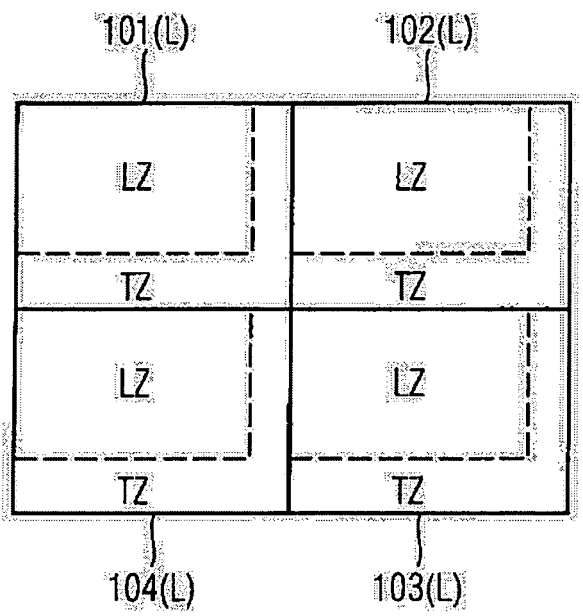
FIG. 9 shows a schematic illustration of a detail from an array of logic function blocks, illustrating the arrangement of the driver cells and the logic cells.

In a manner that is not illustrated, the logic function block L may furthermore contain transistor resources which can be utilized for various tasks. The logic function block L in accordance with FIG. 8 can thus be subdivided further into a logic cell LZ and a driver cell TZ (FIG. 9). This utilization of the driver resources according to the invention may be effected both as local drivers for driving output signals of the logic function block and as global drivers for signal refreshing. In the latter case, signals that are conducted over relatively long paths in the integrated circuit, for example in the higher wiring layers (e.g. M4, M5), are passed at a suitable location vertically downwards into a logic function block L, are amplified there (without carrying out a logic combination) and are conducted back upwards again into the corresponding wiring layer (M4, M5) in order to be relayed.

Driver concepts according to the invention are explained below. FIG. 9 shows four logic functions blocks 101, 102, 103, 104 arranged in a manner situated next to one another without any channels. Each of these logic function blocks 101, 102, 103, 104 contains a logic cell LZ and a driver cell TZ. It is apparent that a logic cell LZ in the array is surrounded by driver cells TZ on all sides, see logic function block 103. In this respect, an adjacent driver resource is always available for each marginal output of a logic cell LZ.

Figure 10:
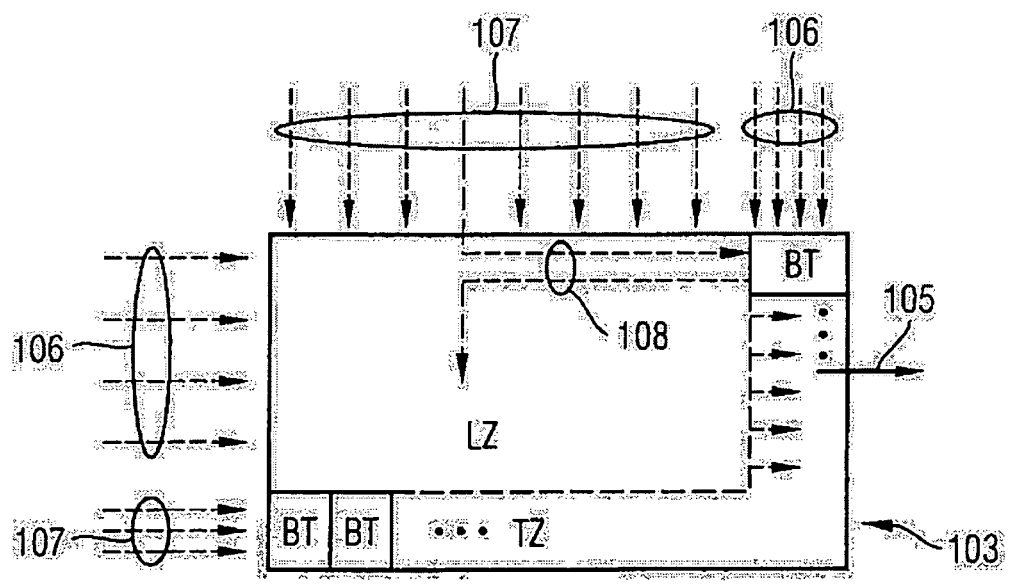
FIG. 10 shows a schematic illustration of a logic function block with an L-shaped driver cell.

FIG. 10 illustrates by way of example, on the basis of the (arbitrary) logic function block 103, that wiring lines which overlap the logic function block always have access to the driver cell TZ. For example, the arrow 105 represents output lines of the logic cell LZ which leave the logic cell via the driver cell TZ. Wiring lines 107 provided for relaying signals over large distances in the semiconductor circuit (global interconnect) have access to the driver cell TZ in the same way as wiring lines 106 provided for signal transmission within a group of adjacent logic function blocks (local interconnect).

The total driver strength available in the logic function block is largely defined by the width of the limbs of the driver cell TZ and the dimensions of the logic cell LZ.

The driver cell TZ is preferably constructed from a multiplicity of basic transistor structures BT, which are fixedly predetermined with regard to the active layer 20, 21 (diffusion layer and polysilicon gate layer) and also the bottommost metallization layer M1 (see FIG. 5). The basic transistor structures BT may be configured in such a way that they realize inverters or buffers. Depending on the desired driver strength, inverters or buffers having a differing driver strength may be formed by means of a suitable contact-connection of basic transistor structures BT by the wiring lines 105, 106 or 107. As extreme cases, all basic transistor structures BT of a driver cell TZ may be connected together to form a single driver having a maximum driver capability, or all basic transistor structures may amplify a separate signal in each case independently of one another.

Furthermore, by means of a suitable contact-connection of a plurality of driver cells TZ, driving elements (inverters or buffers) may be constructed from the transistors or basic transistor structures BT of two or more, preferably adjacent, driver cells TZ. This variant is particularly useful for realizing very large inverters of buffers whose driver strength exceeds the resources of a single driver cell TZ. As will be explained in greater detail later with reference to FIG. 12, a buffer may furthermore be constructed in such a way that it can be used for fixing hold times in order to avoid hold time violations. A possibly multistage buffer having a (very) low driver capability is required in this case.

FIG. 10 makes it clear that the wiring lines 107 can be conducted to the driver cell TZ in a simple manner only because said driver cell has the lower, horizontal limb of the L. If this limb were not present, i.e. if the driver cell TZ were realized only by the vertical limb of the L, each of these wiring lines, as illustrated on the basis of the dash-dotted line 108, would firstly have to perform a change in direction, be lead to the driver cell TZ, be led back to their old signal track position after a signal refresh in the driver cell TZ and, after a further change in direction, be led further in accordance with their original course. On account of the high wiring complexity, a flexible allocation of driver resources for the purposes mentioned would not be possible without the fashioning of the driver cells TZ according to the invention.

In order to enable a change in direction for each wiring line for a configurable driver cell, it is possible to use a traditional crossbar distributor in accordance with FIG. 11. Said crossbar distributor, as already explained in connection with FIGS. 6 and 7, typically comprises two different but successive wiring layers i, i+1 which can be connected by suitable switches at the crossover points. The switches bring about the change in direction. They may be, in the context of an FPGA realization, e.g. tristate buffers 12, pass gates 13 or transfer gates 14 (see FIG. 4). In accordance with the preferred realization of the invention as an MPGA (Mask Programmable Gate Array), vias 10 are used instead. A specific mask programming using vias 10 as switches is illustrated in FIG. 11. The crossbar distributor illustrated in FIG. 11 corresponds constructively to the detail from a crossbar distributor as illustrated in FIG. 6, for which reason reference is made to the description concerning FIG. 6 in order to avoid repetition.

It becomes clear that, by means of the switches that are realized as metal bridges B1, B2 here on all the wiring lines, it is possible to selectively turn off wiring lines that are diverted before and after the crossbar distributor. Consequently, it is possible to switch the output of an inverter or buffer in the driver cell TZ such that a change in direction is effected with regard to the direction of the input line or the direction of the input line is maintained at the output of the inverter or buffer. This holds true both for the case in which the inverter or buffer is constructed from a single basic transistor structure BT, and in those cases in which a plurality of basic transistor structures BT or even a plurality of driver cells are connected together by means of a suitable contact-connection of the wiring lines. Furthermore, it is also possible to switch wiring lines without changes in direction and undriven by means of the driver cell TZ.

The driver cell TZ in combination with the crossbar distributor in accordance with FIG. 11 can thus be interpreted as a universal switching element within an array of logic function blocks since all required basic functions of wiring and signal transmission in a semiconductor circuit are realized in the driver cell TZ in combination with the crossbar distributor.

The invention can also be understood such that there are integrated into the given arrangement in accordance with FIG. 11 (wiring zone for driver cell TZ) transistor structures that are prewired for the driver-cell-specific routing of different signals in the semiconductor circuit and are kept ready by the driver cell TZ. FIG. 12 shows a specific example of a basic transistor structure BT which can be contact-connected by two wiring lines 110, 111 running in the west-east direction, which are situated in the metallization layer i, and four wiring lines 112, 113, 114, 115 running in the north-south direction, which are situated in the wiring layer i+1, and be configured with regard to its driver strength. Further wiring lines in layer i+1 without predefinable configuration possibilities with respect to the driver block are possible in the clearances.

The basic transistor structure BT shown in FIG. 12 comprises two substructures of identical construction which are situated next to one another and are formed by lines 120 in the i−1−th wiring layer. Each substructure has in each case three transistor gates of strip transistors in its upper half OH and in its lower half. The transistor gates are situated where the gate layer 122 overlaps diffusion regions. Each substructure of the driver shown in FIG. 12 is a parallel circuit of three inverters formed by connecting the strip transistors in parallel.

The diffusion layer, the gate layer 122 and the i−1−th wiring layer 120 are fixedly predetermined. As a rule, the wiring in metal i and i+1 (i.e. the wiring lines 110, 111 and also 112 to 115) are also fixedly predetermined, i.e. not customizable. The switches s1 to s20 illustrated in FIG. 12 are mask-programmable. By means of said switches s1 to s20, the basic transistor structure BT can be configured for realizing all the possibilities described above. In this case:

the switches s1, s3, s8, s11, s13, s18 connect the wiring lines 110, 111 in the wiring layer i to the wiring lines 112, 113 and 114 in the wiring layer i+1 by means of a via i;

the switches s10, s20 connect the wiring lines 110, 111 in the wiring layer i to the wiring line 115 in the wiring layer i+1 by means of vias i; and the switches s2, s4, s5, s6, s7, s9, s12, s14, s15, s,16, s17, sl9 connect the wiring lines 110, 111 in the wiring layer i to wiring lines 120 in the wiring layer i−1 for the internal wiring of the basic transistor structure BT by means of vias i−1.

Thus, the wiring line 114 can be connected to the gates of the three coupled inverters for example by setting the switches s1 and s2 (which are also permitted to lie one above the other in a real layout). By setting the switches s14, s15 and s16, a change in direction by 90° is obtained by means of an inverter.

The inverters of the two substructures can be connected in parallel by all the gates being connected to one another by means of the switches s2 and s9 (and respectively s12 and s19) and also the outputs of the previously separate substructures situated next to one another being coupled by means of the switches s14, s15, s16 and s17 (and respectively s4, s5, s6, s7). In this configuration, the upper line 111 (and respectively lower line 110) corresponds to the input of the double inverter and the lower line 110 (and respectively upper line 111) corresponds to the output of the double inverter. Depending on whether the switches s15 and s16 (and respectively s5 and s6) in the right-hand and the left-hand adjacent structure are then set, the output 110 of the double inverter is passed on towards the left and/or right.

Furthermore, a buffer can be produced from the basic transistor structure BT by means of the setting of the switches s1 and s2 and the non-setting of the switches s5 and s6, and also the setting of the switches s14, s15, s16 and s19, and also s7 and, if appropriate, s8. The addition of further metal bridges in the wiring layer i−1 between the switches s2, s3 and s8, s9 and also between the switches s12, s13 and s18, s19 (analogously to the metal bridge shown between the switches s5, s6) increases the flexibility of the arrangement further. It thus becomes possible, by means of the setting of the switches s1, s2, s3 and s4 and by means of the opening of the switches s5 and s6 and also of the newly inserted metal bridge between the switches s2, s3, to configure a connection by means of an inverter without a change in direction to the line 111 running in the west-east direction, without having to occupy line 110 (multiple utilization of the signal track 111).

If smaller buffers are required for the abovementioned problem of fixing acceptance times, the fixed gate layer contacts 121 illustrated by way of example in FIG. 12 (at the overlap regions between the gate layer 122 and the wiring line 120 in the wiring layer i−1), which realize a fixed parallel connection in FIG. 12, can also be embodied in configurable fashion by means of a respective via i−1 to the wiring lines 120 in the wiring layer i−1. The unutilized transistor gates can then advantageously be occupied by a static potential in such a way that the associated transistors are switched into the off state. If said vias i−1 are held in configurable fashion at the gate layer contacts, it is possible to vary the driver strength in the example in accordance with FIG. 12 between one, two or three parallel inverters in a buffer stage, as a result of which the possible gradation is available for providing smaller buffers for fixing the acceptance time.

It is pointed out that the layout shown in FIG. 12 is only one of many possible implementations of the invention in a layout. A via-programmed approach (as explained by the example in FIG. 12) using two via planes and three fixedly predetermined wiring layers (e.g. i−1, i, i+1) is regarded as a preferred realization of the invention. This represents the most favourable variant in respect of area. Gate arrays that are programmed solely by vias (i.e. use metal masks exclusively in a fixed manner) are referred to as VPGA (via-programmable gate array). However, programming by means of a single wiring layer is likewise possible, in principle, and represents the most cost-effective solution. As already mentioned, a transistor realization of the switches for programming (i.e. for the example of the switches s1-s20 as shown in FIG. 12) is likewise possible, although such a realization is relatively complex on account of the multiplicity of switches.

It is pointed out that the first and second aspects of the inventions and also the exemplary embodiments in respect thereof can be combined with one another in any manner, that is to say that, in particular in the application-specific integrated semiconductor circuit in accordance with the first aspect of the invention, the L-shaped driver resources in the logic function blocks L in accordance with the second aspect may be provided and be contact-connected by the wiring zones X.

What is claimed is:

1. A semiconductor circuit having a plurality of logic function blocks in a regular array, each of the logic functional blocks comprises:

a logic cell, which implements the desired logic functionality of the logic function block, and a driver cell, which contains transistors for amplifying signals, the driver cell surrounding the logic cell on only two sides of the logic cell in an L-shaped manner; and a wiring zone in the wiring structure of the semiconductor circuit coupled to the logic function block, the wiring zone comprising at least two wiring layers, the at least two wiring layers comprising wiring lines, wherein wiring lines in different wiring layers of the at least two wiring layers are not parallel to one another, and wherein the wiring lines of the at least two wiring layers are coupled with each other through the driver cell without being coupled through the logic cell.

2. The semiconductor circuit according to claim 1, wherein the driver cell is constructed from a plurality of identical basic transistor structures each comprising a plurality of transistors that are prewired in a specific manner.

3. The semiconductor circuit according to claim 2, wherein a plurality of basic transistor structures of the driver cell are connected together by final configuration to form inverters and/or buffers with different driver strengths.

4. The semiconductor circuit according to claim 2, wherein the driver cell comprises an inverter or a buffer that is constructed from the plurality of basic transistor structures.

5. The semiconductor circuit according to claim 1, wherein the driver cell serves for driving output signals of the logic cell.

6. The semiconductor circuit according to claim 1, wherein the driver cell is utilized for driving signals of a local group of adjacent logic function blocks in the regular array within the semiconductor circuit.

7. The semiconductor circuit according to claim 1, wherein the driver cell is utilized for the further processing of signals which are transmitted over long connections and are intended for remote function blocks of the semiconductor circuit.

8. The semiconductor circuit according to claim 1, wherein the driver cell is utilized for setting the temporal behavior of signals.

9. The semiconductor circuit according to claim 1, wherein the driver cell is utilized for reducing a delay of transmitted signals and/or for signal refreshing in order to fulfill the set-up conditions of a synchronous circuit.

10. The semiconductor circuit according to claim 1, wherein the driver cell is utilized for delaying signals in order to fulfill the hold conditions of a synchronous circuit.

11. The semiconductor circuit according to claim 1, wherein an insulation layer is situated between the at least two wiring layers, the wiring lines of the different wiring layers being connected by means of a mask-programmable and/or configurable direction-changing switch.

12. The semiconductor circuit according to claim 11, wherein the direction-changing switch for connecting the wiring lines of the different wiring layers comprises tristate buffers, pass gates or transfer gates.

13. The semiconductor circuit according to claim 11, wherein the direction-changing switch for connecting the wiring lines of the different wiring layers uses mask-programmable vias in the insulation layer.

14. The semiconductor circuit according to claim 11, wherein mask-programmable and/or configurable switches are provided at the boundaries of the wiring zone, by means of which switches the wiring lines are connected to or isolated from wiring lines of adjacent wiring zones.

15. The semiconductor circuit according to claim 11, wherein the switches are realized by mask-programmable vias in the insulation layer and/or metal bridges.

16. The semiconductor circuit according to claim 11, comprising a mask-programmable contact-connection of the driver cell to the wiring zone, which both defines the signal to be driven and determines what driver strength is used for signal driving.

17. The semiconductor circuit according to claim 11, comprising a mask-programmed contact-connection of the driver cell to the wiring zone in such a way that the inverted or non-inverted input signal of the driver cell appears at the output of the driver cell.

18. The semiconductor circuit according to claim 11, wherein there is arranged in the semiconductor circuit:
   a plurality of wiring zones in a regular array of wiring zones corresponding to the array of logic function blocks.

19. The semiconductor circuit according to claim 11, wherein the wiring lines comprise rows of first line segments and columns of second line segments, the first line segments being perpendicular to the second line segments, wherein each row of the first line segment is connected to only one column of the second line segments through a mask programmable via.

20. The semiconductor circuit according to claim 11, further comprising an adjacent wiring zone, the adjacent wiring zone disposed next to the wiring zone, and connected by metal bridges, wherein wiring lines disposed in a lower wiring layer of the adjacent wiring zone are parallel to wiring lines disposed in a lower wiring layer of the wiring zone.

21. The semiconductor circuit according to claim 20, wherein the wiring lines disposed in the lower wiring layer of the adjacent wiring zone are coupled to the wiring lines disposed in the lower wiring layer of the wiring zone.

22. The semiconductor circuit according to claim 20, wherein each line segment of the wiring lines is connected to only one other line segment of the wiring lines of a different wiring layer through a mask programmable via.

23. A method for the configuration of driver resources within a semiconductor circuit containing a plurality of logic function blocks in a regular array, wherein each logic function block of the plurality of logic function blocks comprises a logic cell, which implements the desired logic functionality of the logic function block, and a driver cell, which contains transistors for amplifying signals, the driver cell surrounding the logic cell on only two sides of the logic cell in an L-shaped manner, wherein the logic function block is coupled to a wiring zone in a wiring structure of the semiconductor circuit, the wiring zone comprising at least two wiring layers, the at least two wiring layers comprising wiring lines, wherein wiring lines in different wiring layers of the at least two wiring layers are not parallel to one another, and wherein the wiring lines of the at least two wiring layers are coupled with each other through the driver cell without being coupled through the logic cell, the method comprising the steps of:
   (a) defining the desired functionality of each driver cell with regard to its function as driver cell for output signals of the logic cell and/or as driver cell for driving signals of a local group of the plurality of logic function blocks and/or for refreshing and/or for delaying global signals; and
   (b) defining a driver-cell-specific contact-connection between the wiring structure of the semiconductor circuit and the driver cells for realizing the desired driver functionality.

24. The method according to claim 23, wherein a mask programming is performed for defining a driver-cell-specific contact-connection between the wiring structure of the semiconductor circuit and the driver cells.

* * * * *